United States Patent
Ahn et al.

(10) Patent No.: US 7,605,409 B2
(45) Date of Patent: Oct. 20, 2009

(54) SEMICONDUCTOR DEVICE, METHOD OF MANUFACTURING THE SAME, SENSE AMPLIFIER AND METHOD OF FORMING THE SAME

(75) Inventors: Soon-Hong Ahn, Gyeonggi-do (KR); Sang-Pyo Hong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 11/673,403

(22) Filed: Feb. 9, 2007

(65) Prior Publication Data

US 2007/0187721 A1 Aug. 16, 2007

(30) Foreign Application Priority Data

Feb. 11, 2006 (KR) .................... 10-2006-0013344

(51) Int. Cl.
*H01L 27/108* (2006.01)
(52) U.S. Cl. ............... 257/211; 257/401; 257/E27.084
(58) Field of Classification Search ............... 257/211, 257/E21.646, 401, E27.084
See application file for complete search history.

(56) References Cited

U.S. PATENT DOCUMENTS 5,029,136 A * 7/1991 Tran et al. ................... 365/205
5,693,970 A * 12/1997 Ikemasu ..................... 257/306
5,849,614 A 12/1998 Chan
6,747,320 B2 * 6/2004 Nakabayashi ............... 257/369
2002/0163022 A1 * 11/2002 Kosugi et al. ............... 257/288

FOREIGN PATENT DOCUMENTS

KR 2001-0084292 9/2001
KR 2005-0060179 6/2005

OTHER PUBLICATIONS

English language abstract of Korean Publication No. 2001-0084292.
English language abstract of Korean Publication No. 2005-0060179.

* cited by examiner

*Primary Examiner*—Minh-Loan T Tran
*Assistant Examiner*—W. Wendy Kuo
(74) *Attorney, Agent, or Firm*—Marger Johnson & McCollom, P.C.

(57) ABSTRACT

A semiconductor device includes first and second unit circuits. Each first unit circuit has first transistors connected in series, wherein each of the first transistors includes a first gate structure having a pitch. Each second unit circuit has second transistors connected in series, wherein each of the second transistors includes a second gate structure having the pitch. A third transistor and a fourth transistor electrically isolate each of the first and second unit circuits, respectively. An insulation layer covers the first through the fourth transistors. Plugs in the insulation layer are connected to a first gate structure, a second gate structure, a first source region, a first drain region, a second source region or a second drain region. A wiring is connected to the plugs.

13 Claims, 15 Drawing Sheets

US 7,605,409 B2

SEMICONDUCTOR DEVICE, METHOD OF MANUFACTURING THE SAME, SENSE AMPLIFIER AND METHOD OF FORMING THE SAME

CROSS-REFERENCE TO RELATED APPLICATIONS

This application claims the benefit of foreign priority to Korean Patent Application No. 2006-13344, filed on Feb. 11, 2006, the disclosure of which is incorporated herein in its entirety by reference.

BACKGROUND

1. Field of Invention

Embodiments of the present invention described herein generally relate to semiconductor devices and methods of manufacturing the same and, more particularly, to a sense amplifier and a method of forming the same.

2. Description of the Related Art

Generally, a semiconductor device is employed for storing data. A random-access memory (RAM) device is a kind of volatile memory device, and is mostly employed as a main memory device for a computer. A dynamic RAM (DRAM) device is a kind of RAM, and includes a unit memory cell having a transistor and a capacitor. A charge is either stored or not stored in the capacitor so that information having a value of "1" or "0," respectively, may be written or read. Over time, charges stored in the capacitor may be lost. Thus, the capacitor included in the memory cell is refreshed in order not to lose the stored charge.

In a memory cell of a DRAM device including a transistor and a capacitor, a word line is connected to a gate structure of the transistor, and a bit line is connected to a source region of the transistor. The word line is enabled to turn on the gate structure so that data stored in the capacitor may be read through a bit line or data may be written in the capacitor through the bit line.

The data stored in a unit cell may be read by the following processes.

A bit line of the transistor is selected. A voltage of the selected bit line and a voltage of a bit line bar adjacent to the selected bit line are output. The output bit line voltage and the output bit line bar voltage are amplified to confirm whether the amplified bit line voltage is higher than the amplified bit line bar voltage or not. Thus, the data in the unit cell may be read using the confirmation result.

Generally, a bit line used in a DRAM device may have either a folded bit line structure or an open bit line structure. In the folded bit line structure, a bit line and a bit line bar are formed in parallel to be connected to a same side of a sense amplifier. In the open bit line structure, a bit line and a bit line bar that is comparable to the bit line are formed apart from each other so that the bit line and the bit line bar are connected to a sense amplifier at different sides of the sense amplifier. The open bit line structure may occupy an area smaller than the folded bit line structure, and thus the open bit line structure is employed for a bit line included in a recent semiconductor memory device having a high integration degree.

FIG. 1 is a plan view illustrating a sense amplifier in a DRAM device having a conventional open bit line structure and FIG. 2 is a cross-sectional view taken along line I-I' and line II-II' shown in FIG. 1.

Referring to FIGS. 1 and 2, an island-shaped active region and an isolation region are formed in a substrate on which a sense amplifier is formed. Two transistors connected in series are formed in the active region.

A unit sense amplifier A, which receives voltage signals from a bit line 14a and a bit line bar 14b and amplifies the voltage signals, thereby reading data in a selected cell, includes a first transistor 12a formed in a first active region 10a and a second transistor 12b formed in a second active region 10b.

In the unit sense amplifier A, the bit line 14a is electrically connected to a first gate structure 16 of the first transistor 12a and a second source region of the second transistor 12b. Additionally, the bit line bar 14b is electrically connected to a second gate structure 18 of the second transistor 12b and a first source region of the first transistor 12a. The above electrical connections may be made through gate plugs 20 and 22 and source plugs 24a and 26a that are connected to the gate structures 16 and 18 and the source regions of the first and second transistors 12a and 12b, respectively. The bit line 14a and the bit line bar 14b make contact with top surfaces of the gate plugs 20 and 22 and the source plugs 24a and 26a.

Additionally, drain plugs 24b and 26b are formed in drain regions of the first and second transistors 12a and 12b, and a wiring 15 is formed to be electrically connected to the drain plugs 24b and 26b.

The unit sense amplifier A selectively drives each transistor electrically connected to the unit sense amplifier A using the voltage signals received from the bit line 14a and the bit line bar 14b so that a difference between the voltage signals of the bit line 14a and the bit line bar 14b may be amplified.

However, a difference between the voltage signals received from the bit line 14a and the bit line bar 14b is small. As a result, it is difficult to amplify the differences between the voltage signals of the bit line 14a and the bit line bar 14b. Thus, an operational defect in which data output from the bit line 14a and the bit line bar 14b are switched, or in which the bit line 14a and the bit line bar 14b always output the same data, may be generated. The above operational defect of the transistors and/or the unit sense amplifier A may occur due to misalignment in a photolithography process.

As shown in FIG. 2, when misalignment occurs in a photolithography process for forming the source and drain plugs 24a, 26a, 24b and 26b, which are electrically connected to the source and the drain regions of the first and second transistors 12a and 12b, respectively, completed source and drain plugs 24a, 26a, 24b and 26b may partially contact isolation regions. As a result, a contact area of each of the plugs 24a, 26a, 24b and 26b with corresponding active regions may vary.

When the contact area of each of the plugs 24a, 26a, 24b and 26b with corresponding active regions varies, a resistance between the plugs 24a, 26a, 24b and 26b and the bit line 14a and the bit line bar 14b may vary. Thus, signal inputs may be delayed in the bit line 14a or the bit line bar 14b having a relatively high resistance so that output signals from the bit line 14a or the bit line bar 14b may be switched or the output signals may always have a constant value of either "1" or "0." Consequently, misalignment occurring in photolithography processes used in forming plugs 24a, 26a, 24b and 26b should be reduced to reduce operational defects such as those mentioned above. However, misalignment margins become very narrow as design rules become gradually reduced. Therefore, there are limits as to how much misalignment can be reduced.

SUMMARY

Embodiments exemplarily described here may be provided to substantially obviate one or more problems due to limitations and disadvantages of the related art. Some embodiments described herein provide a semiconductor device having a structure in which the effect of misalignments of transistors may be reduced. Some embodiments described herein provide a method of manufacturing the semiconductor device having the structure in which the effect of misalignments of the transistors may be reduced. Some embodiments described herein provide a sense amplifier within a semiconductor device having a structure in which the effects of misalignments of transistors may be reduced. Some embodiments described herein provide a method of forming the sense amplifier within the semiconductor device having the structure in which misalignments of the transistors may be reduced.

One embodiment described herein can be exemplarily characterized as a semiconductor device that includes first and second active regions in a substrate; a plurality of first unit circuits in the first active region, wherein each of the plurality of first unit circuits includes a plurality of first transistors, wherein each of the plurality of first transistors includes a first gate structure; a plurality of second unit circuits in the second active region, wherein each of the plurality of second unit circuits includes a plurality of second transistors, wherein each of the plurality of second transistors includes a second gate structure; a third transistor, wherein the plurality of first unit circuits are electrically isolated from each other by the third transistor; a fourth transistor, wherein the plurality of second unit circuits are electrically isolated from each other by the fourth transistor; an insulation layer over the plurality of first unit circuits, the plurality of second unit circuits, the third transistor and the fourth transistor; a plurality of plugs in the insulation layer, wherein the plugs are electrically connected to the first gate structure of one of the plurality of first transistors, the second gate structure of one of the plurality of second transistors, a first source region and a first drain region of the one of the plurality of first transistors, and a second source region and a second drain region of the one of the plurality of second transistors; and a wiring electrically connected to some of the plurality of plugs.

Another embodiment described herein can be exemplarily characterized as a method of manufacturing a semiconductor device that includes forming a first active region and a second active region in a substrate; forming a plurality of first unit circuits in the first active region, wherein each of the plurality of first unit circuits includes a plurality of first transistors, wherein each of the first transistors includes a first gate structure; forming a plurality of second unit circuits in the second active region, wherein each of the plurality of second unit circuits includes a plurality of second transistors, wherein each of the second transistors includes a second gate structure; forming a third transistor, wherein the plurality of first unit circuits are electrically isolated from each other by the third transistor; forming a fourth transistor, wherein the plurality of second unit circuits are electrically isolated from each other by the fourth transistor; forming an insulation layer over the plurality of first unit circuits, the plurality of second unit circuits, the third transistor and the fourth transistor; forming a plurality of plugs in the insulation layer, wherein the plugs are electrically connected to the first gate structure of one of the plurality of first transistors, the second gate structure of one of the plurality of second transistors, a first source region and a first drain region of the one of the plurality of first transistors, a second source region and a second drain region of the one of the plurality of second transistors; and forming a wiring electrically connected to some of the plurality of plugs.

Yet another embodiment described herein can be exemplarily characterized as a semiconductor device that includes a first active region and a second active region in a substrate; a plurality of first unit circuits in the first active region, wherein each of the plurality of first unit circuits includes a plurality of first transistors, wherein each of the first transistors includes a first gate structure; a plurality of second unit circuits in the second active region, wherein each of the plurality of second unit circuits includes a plurality of second transistors, wherein each of the second transistors includes a second gate structure; a third transistor in the first active region, wherein the plurality of first unit circuits are electrically isolated from each other by the third transistor; a fourth transistor in the second active region, wherein the plurality of second unit circuits are electrically isolated from each other by the fourth transistor; a first insulation layer over the first, second, third and fourth transistors; a plurality of plugs in the insulation layer, wherein the plurality of plugs include a first gate plug electrically connected to the first gate structure of one of the plurality of first transistors, a second gate plug electrically connected to the second gate structure of one of the plurality of second transistors, a first source plug and a first drain plug electrically connected to a first source region and a first drain region of the one of the plurality of first transistors, and a second source plug and a second drain plug electrically connected to a second source region and a second drain region of the one of the plurality of second transistors; a bit line and a bit line bar on the first insulation layer, wherein the first gate plug, the second gate plug, the first source plug, and the second source plug are electrically connected to the bit line or the bit line bar; a second insulation layer over the bit line and the bit line bar; a third drain plug electrically connected to the first drain plug or the second drain plug; and a wiring electrically connected to the third drain plug.

Still another embodiment described herein can be exemplarily characterized as a method of forming a semiconductor device that includes forming a first active region and a second active region on a substrate; forming a plurality of first unit circuits in the first active region, wherein each of the plurality of first unit circuits includes a plurality of first transistors, wherein each of the first transistors includes a first gate structure; forming a plurality of second unit circuits in the second active region, wherein each of the plurality of second unit circuits includes a plurality of second transistors connected in series, wherein each of the second transistors includes a second gate structure; forming a third transistor in the first active region, wherein the plurality of first unit circuits are electrically isolated from each other by the third transistor; forming a fourth transistor in the second active region, wherein the plurality of second unit circuits are electrically isolated from each other by the fourth transistor; forming a first insulation layer over the first, second, third and fourth transistors; forming a plurality of plugs in the insulation layer, wherein the plurality of plugs include a first gate plug electrically connected to the first gate structure of one of the plurality of first transistors, a second gate plug electrically connected to the second gate structure of one of the plurality of second transistors, a first source plug and a first drain plug electrically connected to a first source region and a first drain region of the one of the plurality of first transistors, and a second source plug and a second drain plug electrically connected to a second source region and a second drain region of the one of the plurality of second transistors; forming a bit line and the bit line bar, wherein the first gate plug, the second gate plug, the first source plug, and the second source plug are electrically connected to the bit line or the bit line bar; forming a second insulation layer over the bit line and the bit line bar; forming a third drain plug electrically connected to the first drain plug or the second drain plug; and forming a wiring configured to be electrically connected to the third drain plug.

A further embodiment described herein can be exemplarily characterized as a semiconductor device that includes a sense amplifier including a first transistor coupled to a second transistor; a third transistor adjacent to the first transistor, wherein the first transistor and the third transistor share a source region; and a fourth transistor adjacent to the second transistor, wherein the second transistor and the fourth transistor share a common source region, wherein the third and fourth transistors are electrically coupled to each other.

DETAILED DESCRIPTION

Figure 1:
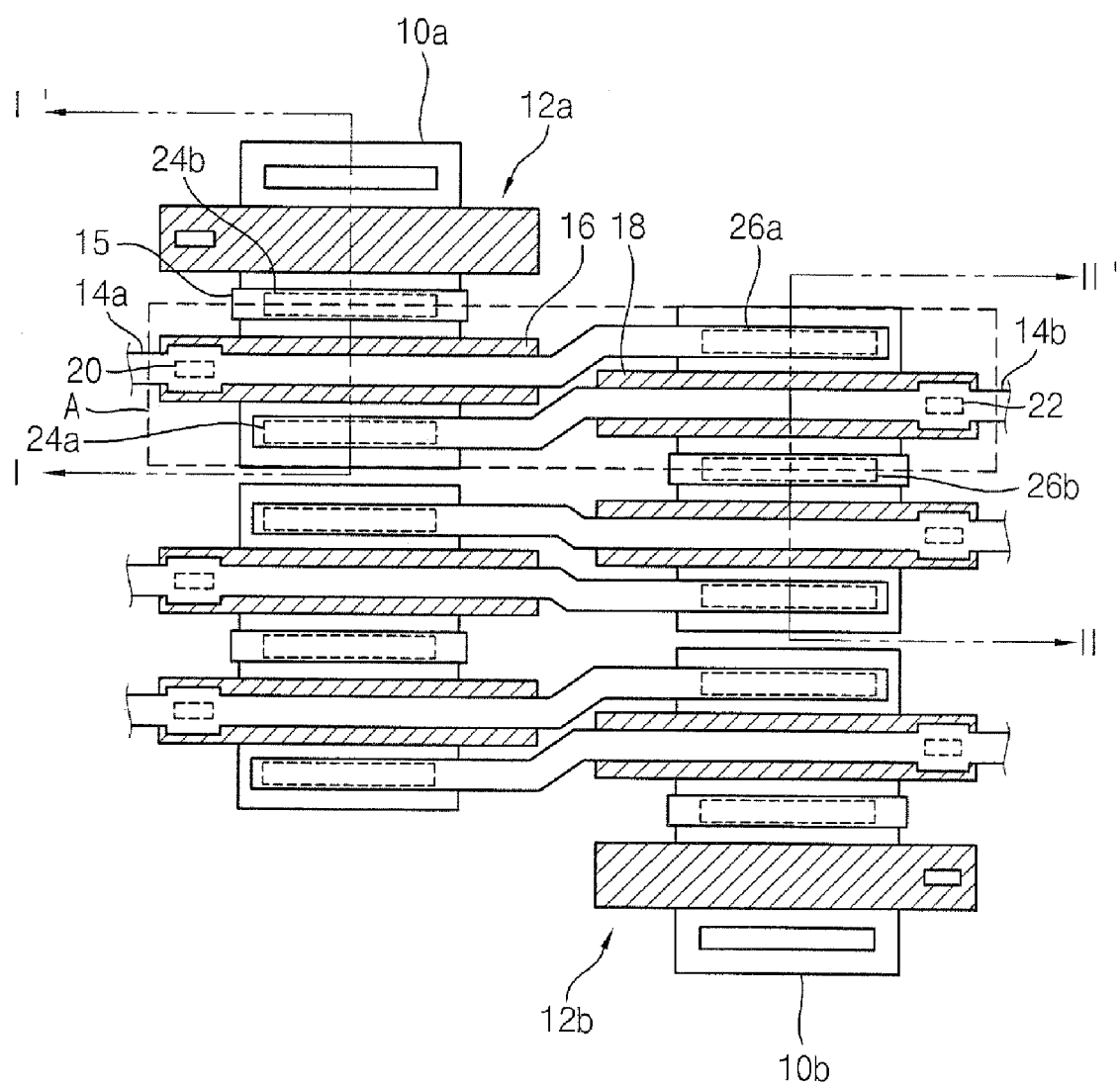
FIG. 1 is a plan view illustrating a sense amplifier in a dynamic random-access memory (DRAM) device having a conventional open bit line structure.
Figure 2:
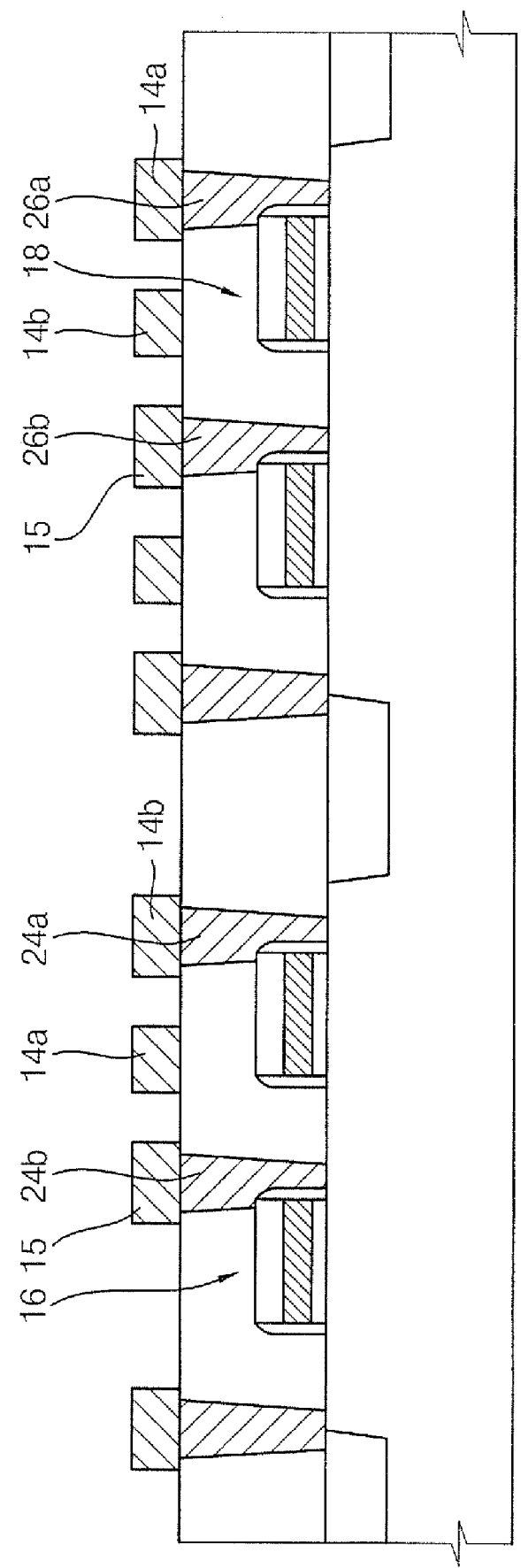
FIG. 2 is a cross-sectional view taken along line I-I' and line II-II' in FIG. 1.

Example embodiments of the present invention now will be described more fully with reference to the accompanying drawings. These embodiments may, however, be realized in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

Although the terms first, second, etc., may be used herein to describe various elements, it will be understood that these elements should not be limited by these terms. These terms are used to distinguish one element from another. For example, a first element could be termed a second element, and, similarly, a second element could be termed a first element, without departing from the scope of the embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
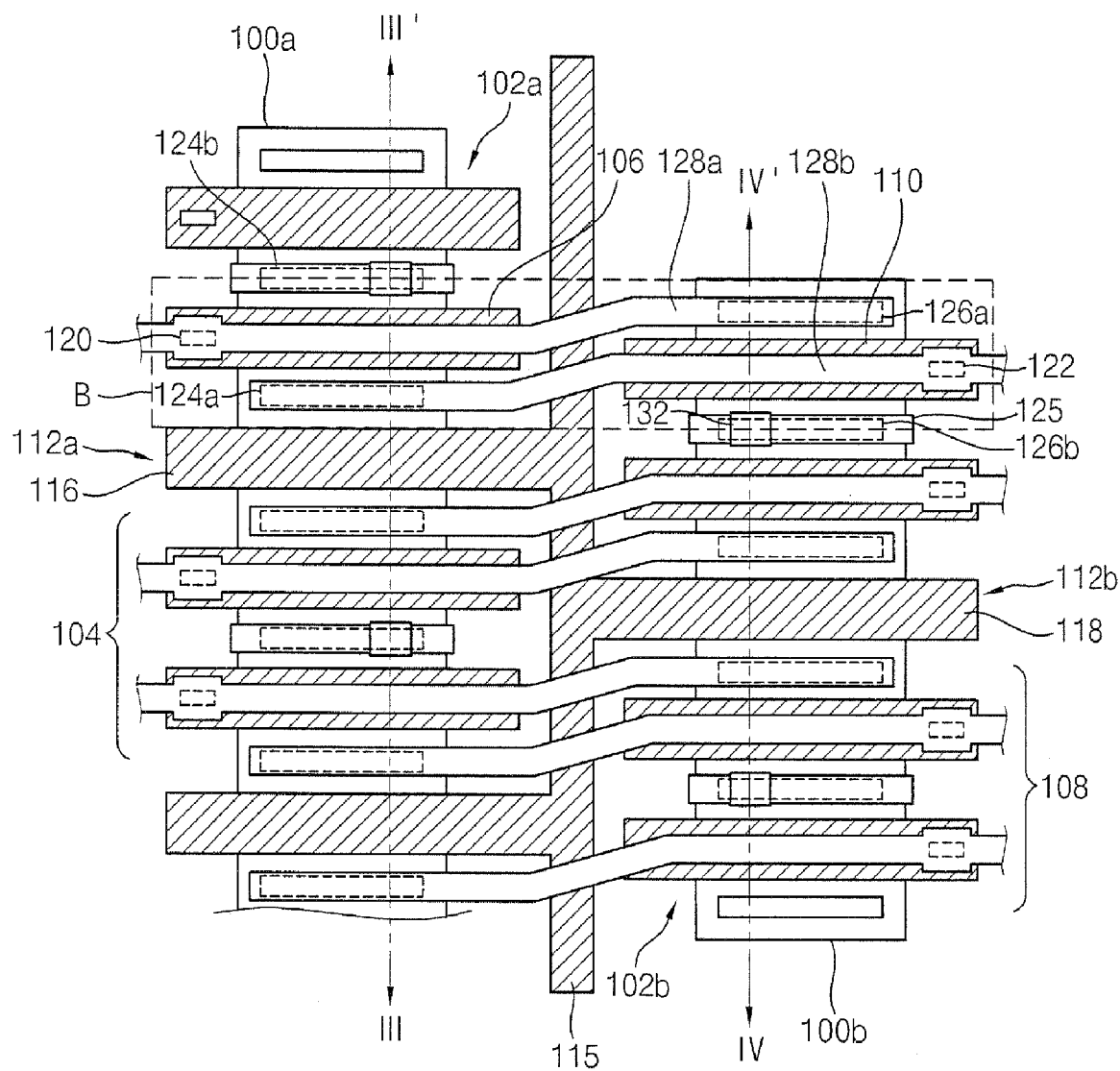
FIG. 3 is a plan view illustrating one example embodiment of a semiconductor device.
Figure 4:
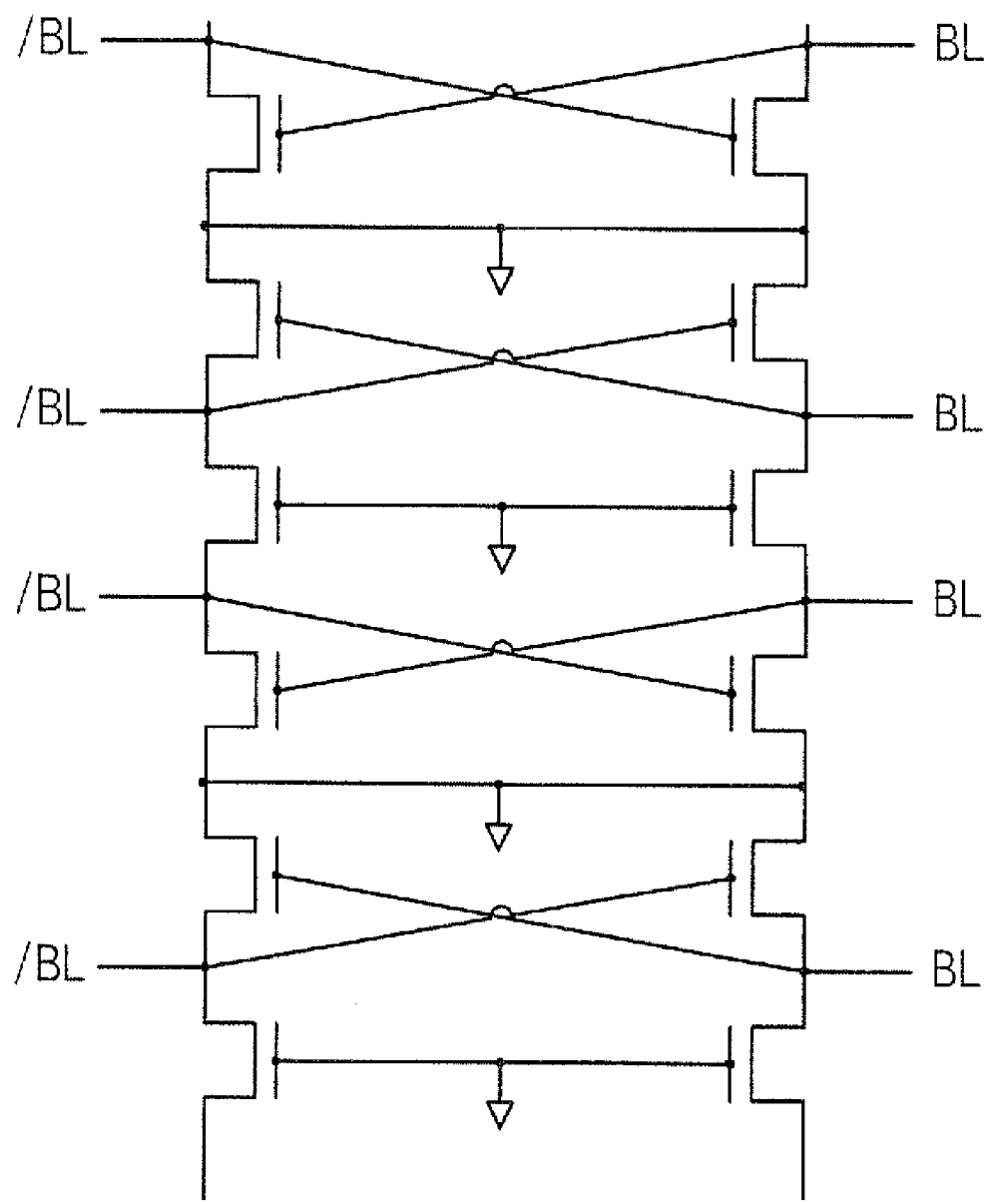
FIG. 4 is a circuit diagram illustrating the semiconductor device shown in FIG. 3.

FIG. 3 is a plan view illustrating one embodiment of a semiconductor device (e.g., a sense amplifier in a dynamic random-access memory (DRAM) device) and FIG. 4 is a circuit diagram illustrating the semiconductor shown in FIG. 3.

Referring to FIG. 3, a substrate having a cell area and a peripheral area is prepared.

A first active region 100a and a second active region 100b may be formed in a core region of the peripheral area. Additionally, an active region (not shown) for forming each cell is also formed in the cell area. In the illustrated embodiment, the first and second active regions 100a and 100b may have a linear shape and extend along a given direction and be disposed in parallel to each other.

A plurality of first unit circuits 104, including first transistors 102a connected in series, are disposed in the first active region 100a. First gate structures 106 included in the first transistors 102a of a first unit circuit 104 are separated from each other by a first pitch. As used herein, the first pitch is a sum of critical dimensions (CDs) of each of the gate structures 106 and intervals between each of the gate structures 106. In one embodiment, each of the gate structures 106 included in each of the first transistors 102 has substantially the same CD and the intervals between each of the gate structures 106 are substantially the same.

Each first unit circuit 104 includes at least two first transistors 102a which are disposed adjacent to each other so as to have a common first drain region. In one example embodiment, each first unit circuit 104 has two first transistors 102a.

Additionally, a plurality of second unit circuits 108, including second transistors 102b connected in series, are disposed in the second active region 100b. Second gate structures 110 included in the second transistors 102b of a second unit circuit 108 are separated from each other by the first pitch.

Each second unit circuit 108 includes at least two second transistors 102b which are disposed adjacent to each other so as to have a common second drain region. In one example embodiment, each second unit circuit 108 has two second transistors 102b.

A unit sense amplifier B may include one of the first transistors 102a and one of the second transistors 102b. The first and second transistors 102a and 102b may have substantially the same electrical characteristics. Thus, the second active region 100b and the second transistors 102b may be formed under substantially the same conditions as those of the first active region 100a and the first transistors 102a, respectively.

A third transistor 112a and a fourth transistor 112b are formed in the first and second active regions 100a and 100b, respectively. The third transistor 112a and the fourth transistor 112b electrically isolate each of the first unit circuits 104 and each of the second unit circuits 108, respectively. For example, the third transistor 112a is disposed in the first active region 100a and includes a third gate structure 116 as well as first source regions of the first unit circuits 104, which are disposed at both sides of the third gate structure 116. Additionally, the fourth transistor 112b is disposed in the second active region 100b and includes a fourth gate structure 118 as well as second source regions of the second unit circuits 108, which are disposed at both sides of the fourth gate structure 118.

The third and fourth gate structures 116 and 118 of the third and fourth transistors 112a and 112b may be connected to each other so that the same signals may be applied to the third and fourth gate structures 116 and 118 that are formed in the first and second active regions 100a and 100b, respectively. In one example embodiment, the third and fourth gate structures 116 and 118 may be connected to each other by a fifth gate structure 115.

The first through the fourth transistors 102a, 102b, 112a and 112b have the same conductivity type. In one example embodiment, all of the first through the fourth transistors 102a, 102b, 112a and 112b may be provided as N-type transistors. The sense amplifier B having the N-type transistors 102a, 102b, 112a and 112b will now be described.

A first insulation layer (not shown) is formed on the substrate to cover the transistors 102a, 102b, 112a and 112b.

A first gate plug 120, a second gate plug 122, a first source plug 124a, a second source plug 126a, a first drain plug 124b and a second drain plug 126b (collectively referred to as "plugs") are formed in the first insulation layer and are electrically connected to various ones of the first and second transistors 102a and 102b. The first and second gate plugs 120 and 122 are connected to the first and second gate structures 106 and 110, respectively. The first and second source plugs 124a and 126a are connected to the first and second source regions, respectively. The first and second drain plugs 124b and 126b are connected to the first and second drain regions, respectively.

A bit line 128a and a bit line bar 128b are formed on the first insulation layer. In an example embodiment, the sense amplifier B has an open bit line structure wherein the bit line 128a and the bit line bar 128b both extend from outside the sense amplifier B toward the sense amplifier B and are connected to the sense amplifier B.

In an example embodiment, the bit line 128a extends from the left of the sense amplifier B toward the sense amplifier B and is connected to the first gate plug 120, which is connected to the first gate structure 106 of the first transistor 102a. The bit line 128a is also connected to the second source plug 126a, which is connected to the second source region of the second transistor 102b. The bit line bar 128b extends from the right of the sense amplifier B toward the sense amplifier B and is connected to the second gate plug 122, which is connected to the second gate structure 110 of the second transistor 102b. The bit line bar 128b is also connected to the first source plug 124a, which is connected to the first source region of the first transistor 102a.

A pad 125 is formed on each of the first and second drain plugs 124b and 126b, which are connected to the first and second drain regions of the first and second transistors 102a and 102b, respectively. Pad 125 may be useful in subsequently forming a third drain plug 132.

A second insulation layer (not shown) is formed on the first insulation layer to cover the bit line 128a, the bit line bar 128b and the pad 125.

The third drain plug 132 is formed on the second insulation layer to be electrically connected to the first and second drain regions of the first and second transistors 102a and 102b. The third drain plug 132 contacts a top surface of the pad 125, which is electrically connected to the drain regions of the first and second transistors 102a and 102b. Additionally, a metal wiring (not shown) may be further formed on the drain plug 132 and be electrically connected to the drain plug 132.

When a voltage level of the bit line 128a is higher or lower than that of the bit line bar 128b due to data stored in the cell, only one of the first and second transistors 102a and 102b is turned on. Additionally, the voltage level of one of the bit line 128a and the bit line bar 128b increases or decreases by being electrically connected to the turned-on transistor so that a difference between voltage levels of the bit line 128a and the bit line bar 128b may increase.

Operations of the sense amplifier B will be exemplarily described with reference to FIG. 4, Specifically, an operation of the sense amplifier B when a voltage of the bit line 128a is higher than that of the bit line bar 128b will be described.

When the voltage of the bit line BL is higher than that of the bit line bar /BL due to data stored in the cell, the first transistor 102a is selectively turned on by the voltage of the bit line BL in a predetermined time. The voltage of the bit line BL is also applied to the second source region of the second transistor 102b. Meanwhile, the voltage of the bit line bar /BL is applied to the first source region of the first transistor 102a and a current flows to the first drain region via the turned-on first transistor 102a.

As described above, the first and second drain regions of the first and second transistors 102a and 102b have a ground voltage level. That is, the metal wiring electrically connected to the third drain plug 132 is connected to ground. As a result, current flowing through the first drain region is transmitted to the ground so that the voltage of the bit line bar /BL becomes much lower than that of the bit line BL.

When the voltage of the bit line BL is higher than that of the bit line bar /BL, the sense amplifier B operates in a method opposite to the above description, and the voltage of the bit line BL becomes much lower than that of the bit line bar /BL.

In another embodiment, the first through the fourth transistors 102a, 102b, 112a and 112b may be provided as P-type transistors. When the sense amplifier B is formed of P-type transistors 102a, 102b, 112a and 112b, the first and second drain regions of the first and second transistors 102a and 102b may have a power source voltage level. Thus, the power source voltage is applied to the selectively turned-on transistor to increase the voltage of the bit line BL or the bit line bar /BL, which is connected to a source region of the turned-on transistor.

As described above, only one of the first and second transistors 102a and 102b of the exemplarily described sense amplifier B is turned on by the minute difference between the voltages of the bit line BL and the bit line bar /BL due to data stored in the cell. Thus, the difference between voltage levels of the bit line BL and the bit line bar /BL may be amplified.

However, the difference between the voltages of the bit line BL and the bit line bar /BL is very minute. Thus, the first and second transistors 102a and 102b should have substantially the same electrical characteristics in order that signals may be correctly amplified. Particularly, the plugs 120, 122, 124a, 124b, 126a and 126b need to have substantially the same resistance.

In one embodiment, the aforementioned sense amplifier may include an isolation transistor instead of an isolation layer found in a conventional sense amplifier. When the sense amplifier B has N-type transistors, a turn-off transistor, of which a gate structure is fixed to a ground voltage level, may be formed as the isolation transistor instead of the isolation layer. When the sense amplifier has P-type transistors, a turn-off transistor, of which a gate structure is fixed to a power source voltage level, is formed as the isolation transistor instead of the isolation layer.

Thus, the source and drain plugs 124a, 126a, 124b and 126b, which are connected to the source and drain regions of the transistors 102a and 102b only contact active regions and do not contact an isolation layer including an insulating material as in the conventional art. Additionally, the area with which each of the source and drain plugs 124a, 126a, 124b and 126b contacts corresponding active regions is substantially the same even if misalignments of the source and drain plugs 124a, 126a, 124b and 126b occur. Therefore, mismatches in the first and second transistors due to differences between the area with which each of the source and drain plugs 124a, 126a, 124b and 126b contacts corresponding active regions may be reduced. Accordingly, operational defects of the sense amplifier may be reduced.

FIGS. 5 to 10 are cross-sectional views illustrating an example method of forming the semiconductor device shown in FIG. 3, taken along line III-III' and line IV-IV' in FIG. 3 and FIGS. 11 to 15 are plan views illustrating an example method of forming the semiconductor device shown in FIG. 3.

Figure 5:
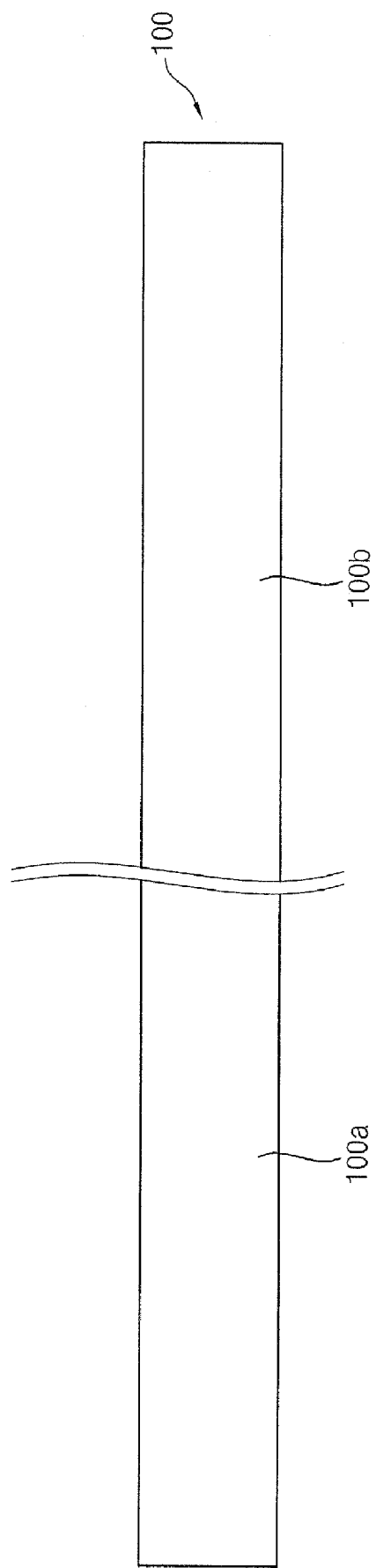
FIGS. 5 to 10 are cross-sectional views illustrating an example method of forming the semiconductor device shown in FIG. 3, taken along line III-III' and line IV-IV' in FIG. 3.
Figure 11:
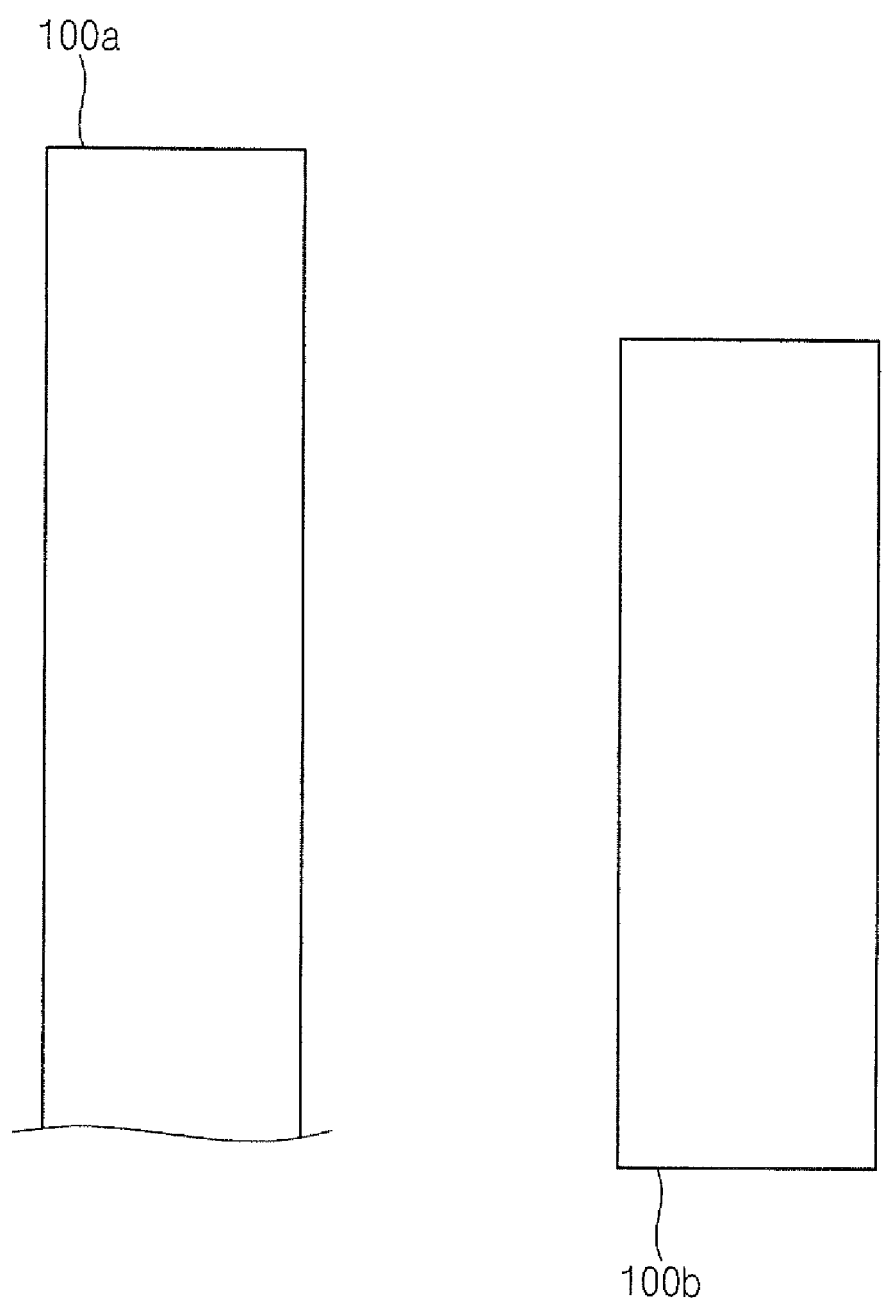
FIGS. 11 to 15 are plan views illustrating an example method of forming the semiconductor device shown in FIG. 3.

Referring to FIGS. 5 and 11, a semiconductor substrate 100 including a cell area and a peripheral area is provided. An isolation process may be performed to divide the semiconductor substrate 100 into an active region and an isolation region. A first active region 100a and a second active region 100b are formed in a core region of the peripheral area. The first and second active regions 100a and 100b may have linear shapes extending along a given direction and may be disposed in parallel. In one embodiment, each of the first and second active regions 100a and 100b may have an island shape.

In one embodiment, the isolation region may be formed by partially removing an upper portion of the semiconductor substrate 100 to form a trench (not shown). The trench may have a linear shape extending along the given direction. The trench may then be filled with an insulating material, thereby forming an isolation layer. Thus, the first and second active regions 100a and 100b and the isolation region, which extend along the given direction, are formed in the semiconductor substrate 100.

Figure 6:
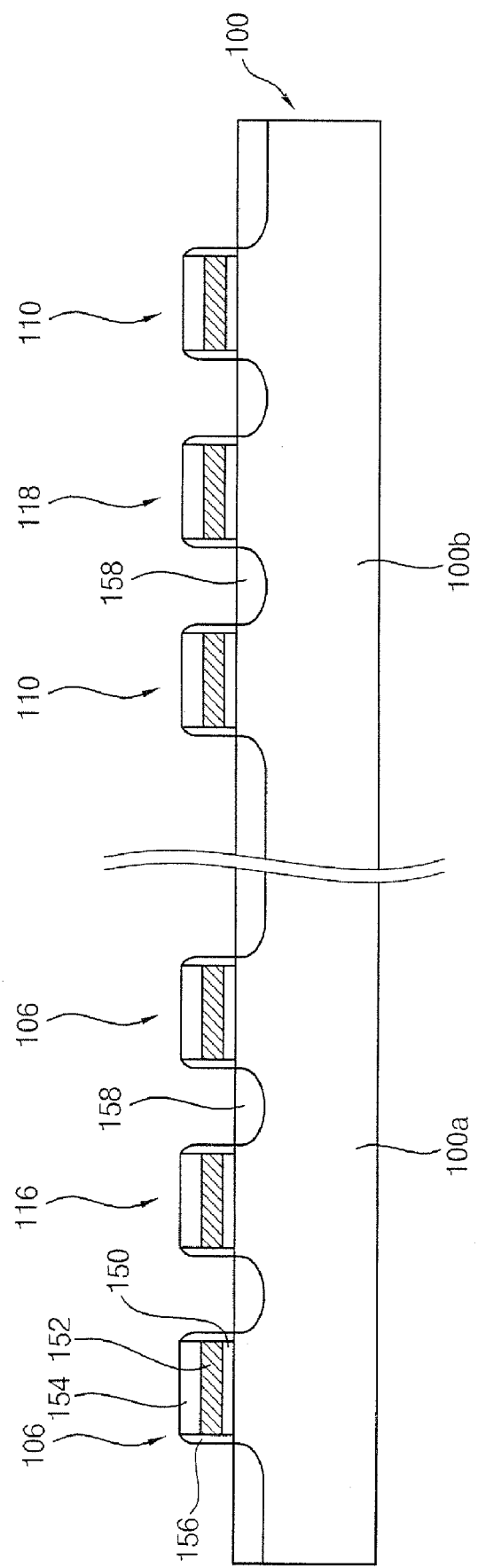
Figure 12:
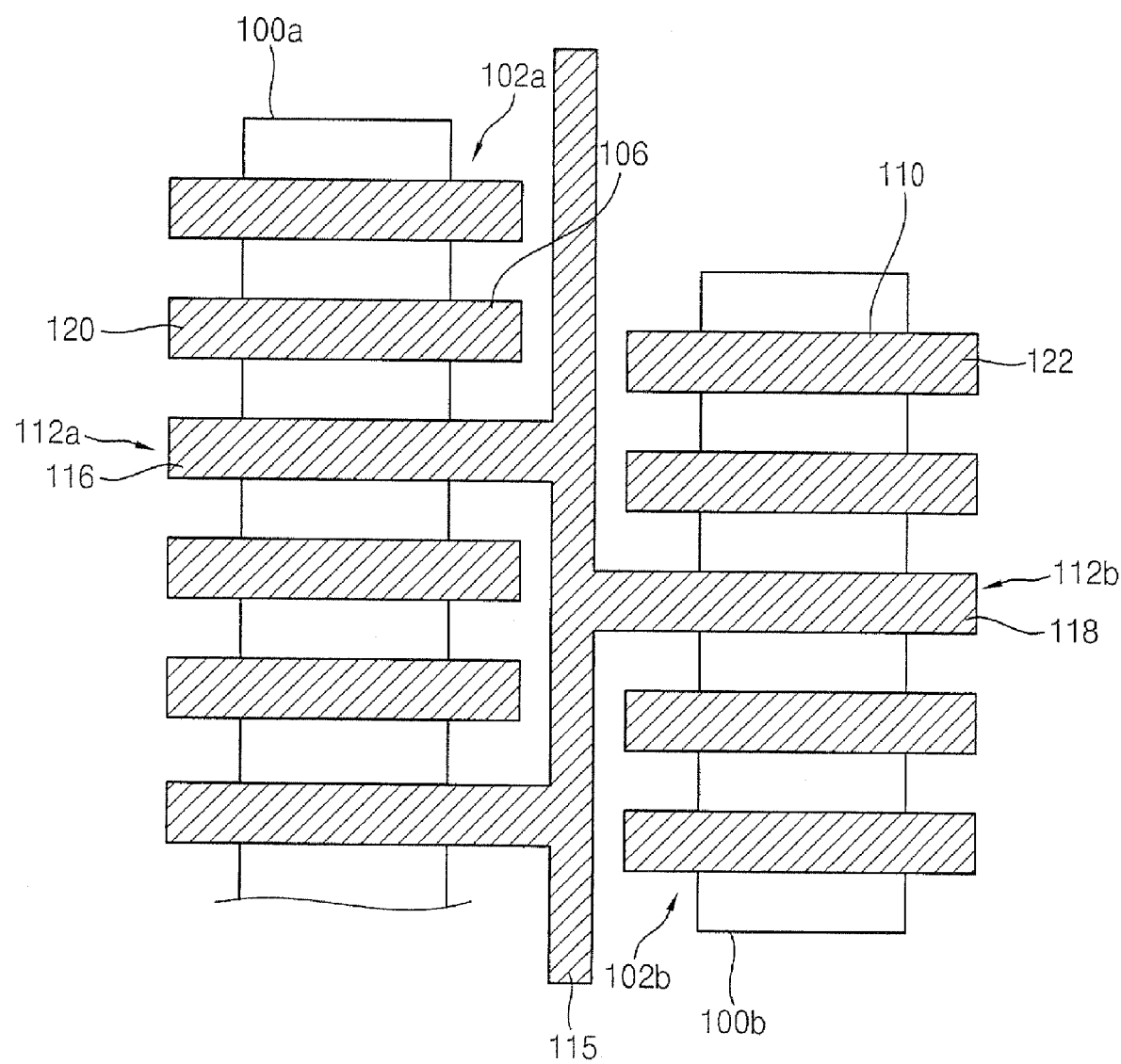

Referring to FIGS. 6 and 12, a plurality of first transistors 102a and a plurality of second transistors 102b, which may be driven by signals provided by a bit line 128a and a bit line bar 128b (see FIG. 9), may be formed. In one embodiment, a first unit circuit 104 (see FIG. 14) includes first transistors 102a connected in series and formed within the first active region 10a and a second unit circuit 108 (see FIG. 14) includes second transistors 102b connected in series and formed within the second active region 100b.

As illustrated, a third transistor 112a is formed between the first unit circuits 104, and a fourth transistor 112b is formed between the second unit circuits 108. The third and fourth transistors 112a and 112b may be configured as isolation transistors. A cell transistor (not shown) serving as a word line may be formed in the cell area (e.g., in the same process used to form the third and fourth transistors 112a and 112b).

An example method of forming the first through the fourth transistors 102a, 102b, 112a and 112b will now be described.

A gate dielectric layer (e.g., a gate oxide layer) may be formed on the semiconductor substrate 100 by a process such as thermal oxidation or chemical vapor deposition (CVD).

A first conductive layer and a first hard mask layer may then be sequentially formed on the gate dielectric layer. The first conductive layer may include a material such as doped polysilicon.

A first photoresist pattern (not shown) may be formed on the first hard mask layer, and the first hard mask layer may be partially etched using the first photoresist pattern as an etching mask, thereby forming a first hard mask pattern 154.

The first conductive layer and the gate dielectric layer may then be partially etched using the first hard mask pattern 154 to form a plurality of first gate structures 106 in the first active region 100a and a plurality of second gate structures 110 in the second active region 100b. Each of the first and second gate structures 106 and 110 includes a gate dielectric layer pattern 150, a gate conductive layer pattern 152 and the first hard mask pattern 154 sequentially stacked on the semiconductor substrate 100. Additionally, a third gate structure 116, which may be configured to isolate each of the first gate structures 106, and a fourth gate structure 118, which may be configured to isolate each of the second gate structures 108, may be formed in the first and second active regions 100a and 100b, respectively. Further, cell gate structures (not shown) may be formed in the cell area.

In an example embodiment, the third gate structure 116 may be formed between two first gate structures 106, and the fourth gate structure 118 may be formed between two second gate structures 108. The third and fourth gate structures 116 and 118 may be connected to each other. In an example embodiment, a fifth gate structure 115 may be further formed to connect the third and fourth gate structures 116 and 118.

The first and second gate structures 106 and 110 may be formed to have substantially the same pitch. That is, the first and second gate structures 106 and 110 may be formed so that the first and second gate structures 106 and 110 have substantially the same CD, and intervals between each of the first gate structures 106 and intervals between each of the second gate structures 110 are substantially the same.

A gate spacer 156 is formed on each sidewall of the first through the fourth gate structures 106, 110, 116 and 118.

Impurities are introduced (e.g., implanted) into upper portions of the semiconductor substrate 100 adjacent to the first through the fourth gate structures 106, 110, 116 and 118 and the cell gate structures. The semiconductor substrate 100 is subjected to a heat treatment process to form impurity regions 158 at the upper portions of the semiconductor substrate 100. The impurity regions 158 may be provided as source and drain regions. For example, a first source region may be formed in the first active region 100a and a second source region formed in the second active region 100b. Further, a first drain region may be formed in the first active region 100a and a second drain region may be formed in the second active region 100b.

The first transistors 102a, connected in series to each other, and the second transistors 102b, connected in series to each other, are formed in the first and second active regions 100a and 100b, respectively. Additionally, the third transistor 112a is formed between two of the first transistors 102a having a common first drain region, and the fourth transistor 112b is formed two of the second transistors 102b having a common second drain region.

Figure 7:
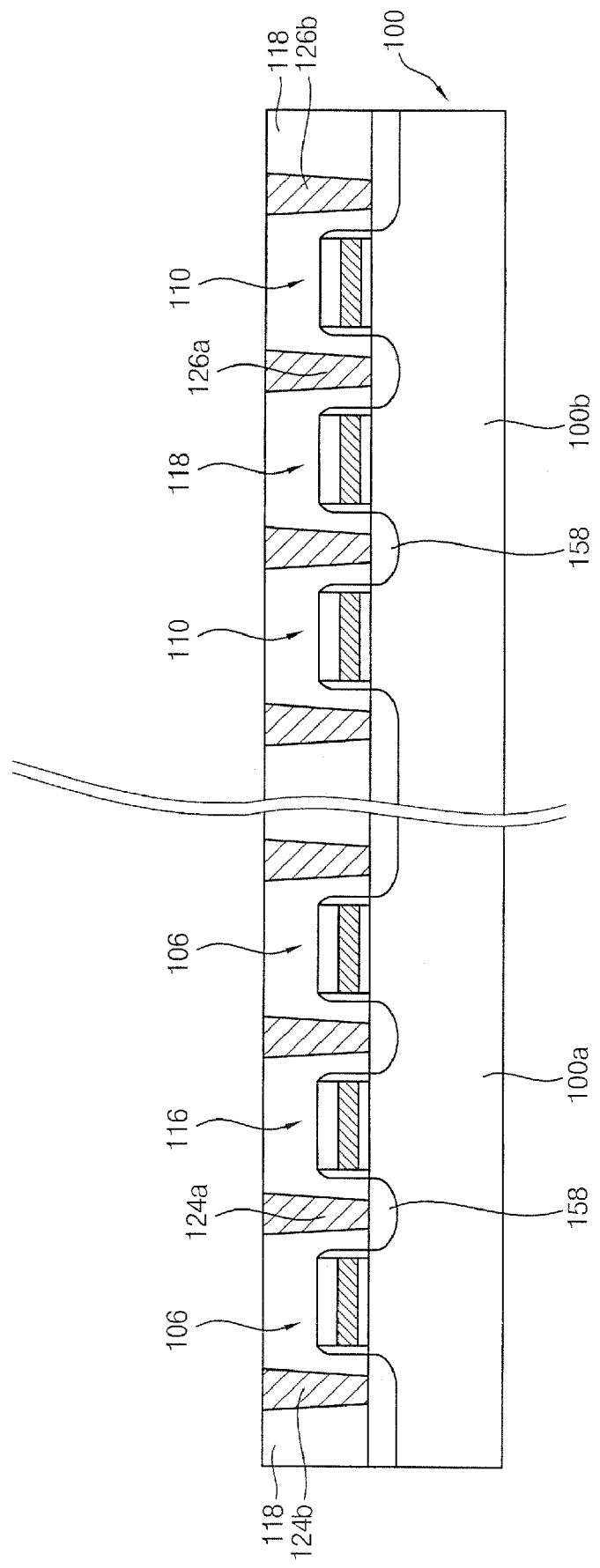
Figure 13:
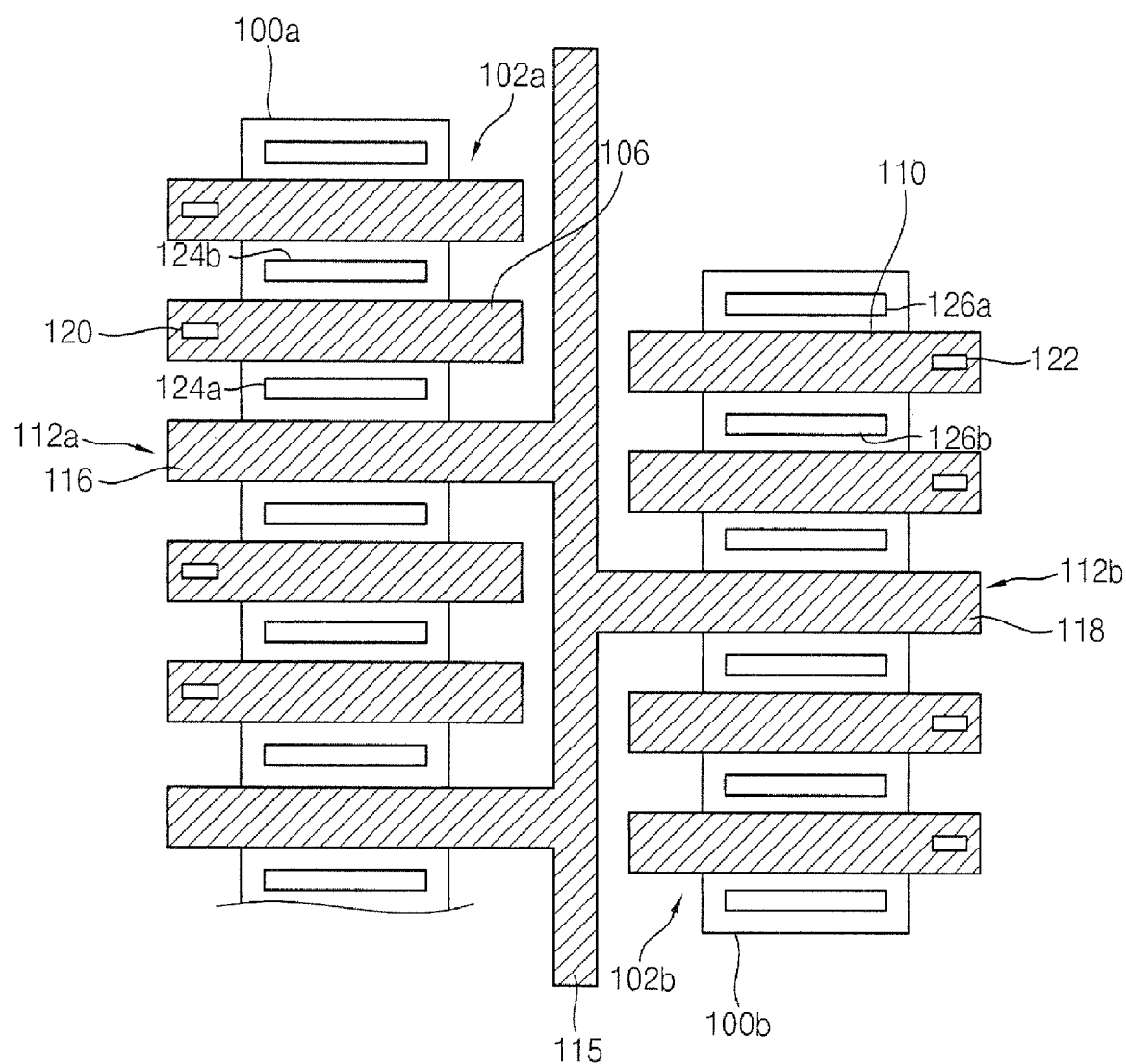

Referring to FIGS. 7 and 13, a first insulation layer 118 is formed to cover the first through fifth gate structures 106, 110, 116, 118 and 115. The first insulation layer 118 may include, for example, an oxide material (e.g., borophosphosilicate glass (BPSG), phosphosilicate glass (PSG), spin-on glass (SOG), plasma-enhanced tetraethylorthosilicate (PE-TEOS), undoped silicate glass (USG) or high-density plasma CVD (HDP-CVD) oxide). The first insulation layer 118 may be formed according to a process such as a CVD process, a plasma-enhanced CVD (PE-CVD) process, an HDP-CVD process or an atomic layer deposition (ALD) process.

A planarization process may be performed on the first insulation layer 118. The planarization process may be performed by a chemical mechanical polishing (CMP) process in which a top surface of the first insulation layer 118 may be removed. Additionally, another insulation layer may be deposited on the first insulation layer 118.

A second photoresist pattern (not shown) may be formed on the first insulation layer 118 and employed as an etching mask pattern that partially exposes portions of first insulation layer 118 over the first and second gate structures 106 and 110 and the impurity regions 158 of the first and second transistors 102*a* and 102*b*.

The first insulation layer 118 is then etched using the second photoresist pattern to form first openings that partially expose the top surfaces of the first and second gate structures 106 and 110 and the impurity regions 158 of the first and second transistors 102*a* and 102*b*. The second photoresist pattern may be removed by an ashing process and/or a stripping process.

A second conductive layer (not shown) is formed on the first insulation layer 118 to fill the first openings. The second conductive layer may include a material such as doped polysilicon, metal, or the like.

The second conductive layer is then removed by a CMP process until a top surface of the first insulation layer 118 is exposed, thereby forming a first gate plug 120, a second gate plug 122, a first source plug 124*a*, a second source plug 126*a*, a first drain plug 124*b* and a second drain plug 126*b* within the first openings. The first and second gate plugs 120 and 122 are electrically connected to the first and second gate structures 106 and 110, respectively. The first and second source plugs 124*a* and 126*a* are electrically connected to the first and second source regions. The first and second drain plugs 124*b* and 126*b* are electrically connected to the first and second drain regions.

An isolation layer is not formed between the first and second source plugs 124*a* and 126*a*. Additionally, an isolation layer is not formed between the first and second drain plugs 124*b* and 126*b*.

Figure 8:
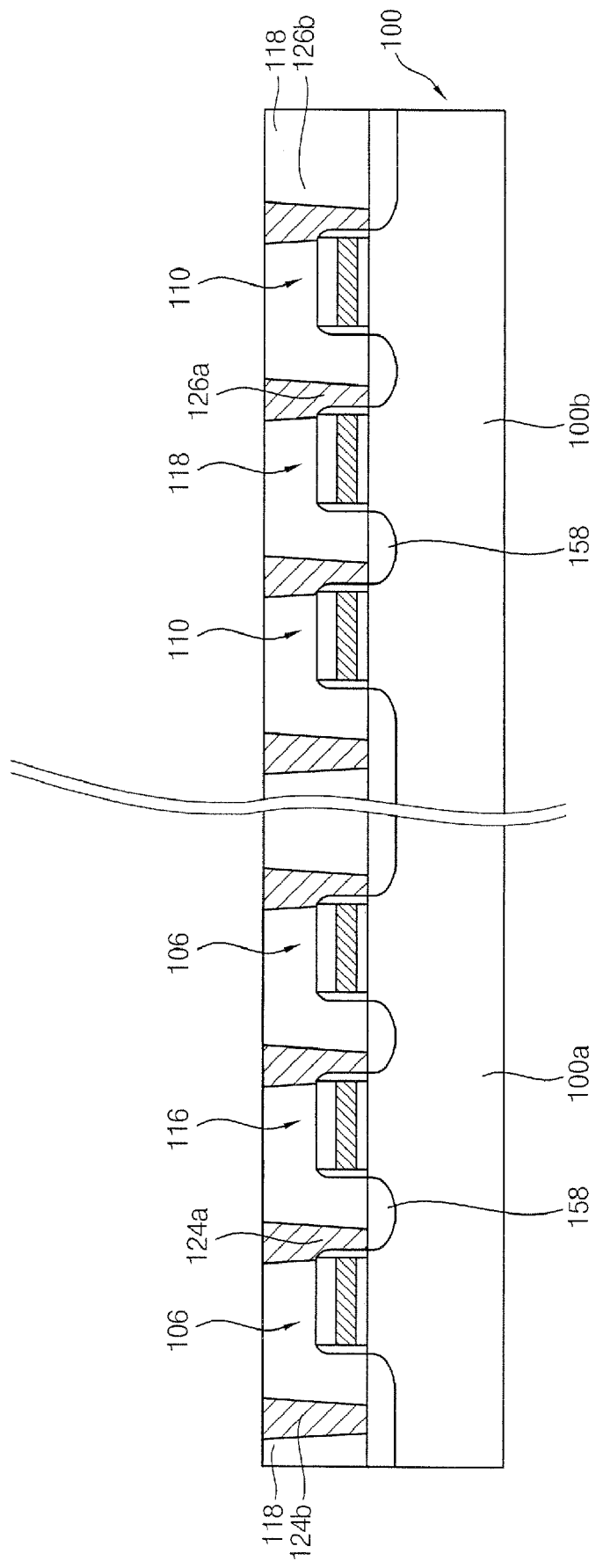

As shown in FIG. 8, the contact area between each of the source and drain plugs 124*a*, 126*a*, 124*b* and 126*b* and a corresponding active region are substantially the same (i.e., are not different from one another) even if misalignments of the source and drain plugs 124*a*, 126*a*, 124*b* and 126*b* occur. Thus, contact resistances of the source and drain plugs 124*a*, 126*a*, 124*b* and 126*b* are substantially the same (i.e., are not different from one another).

Figure 9:
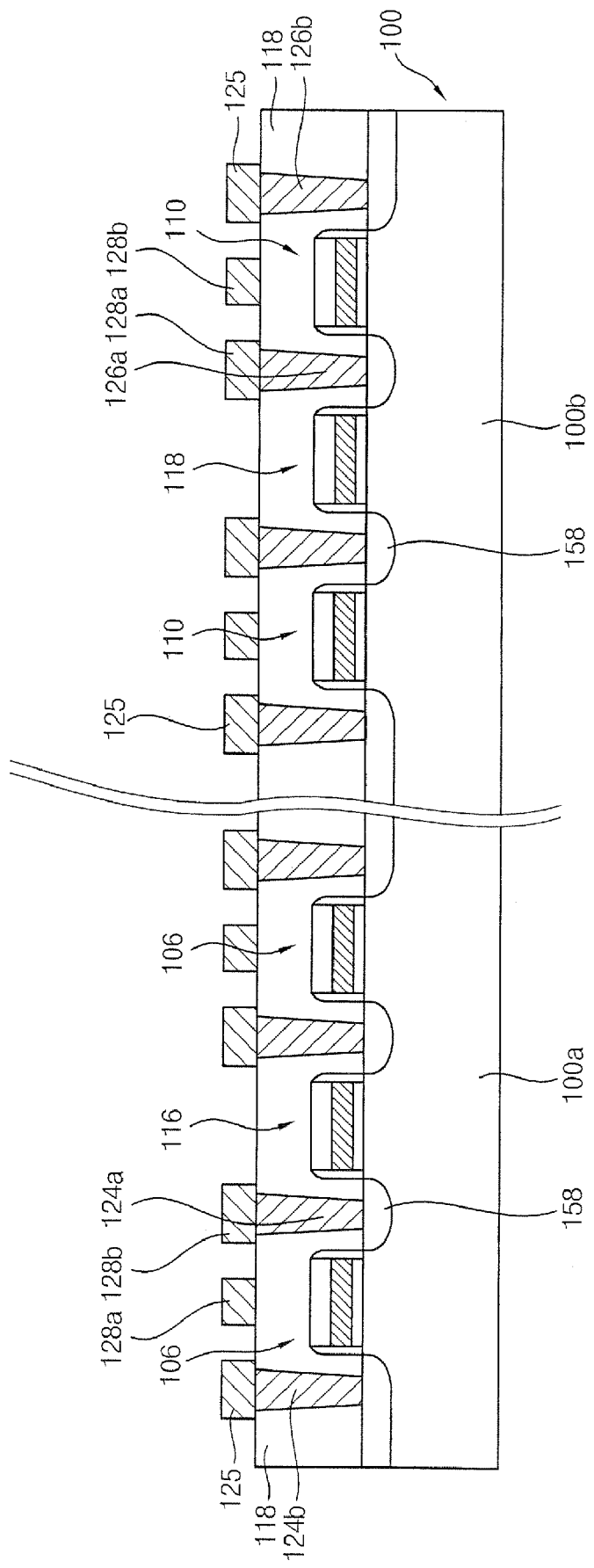
Figure 14:
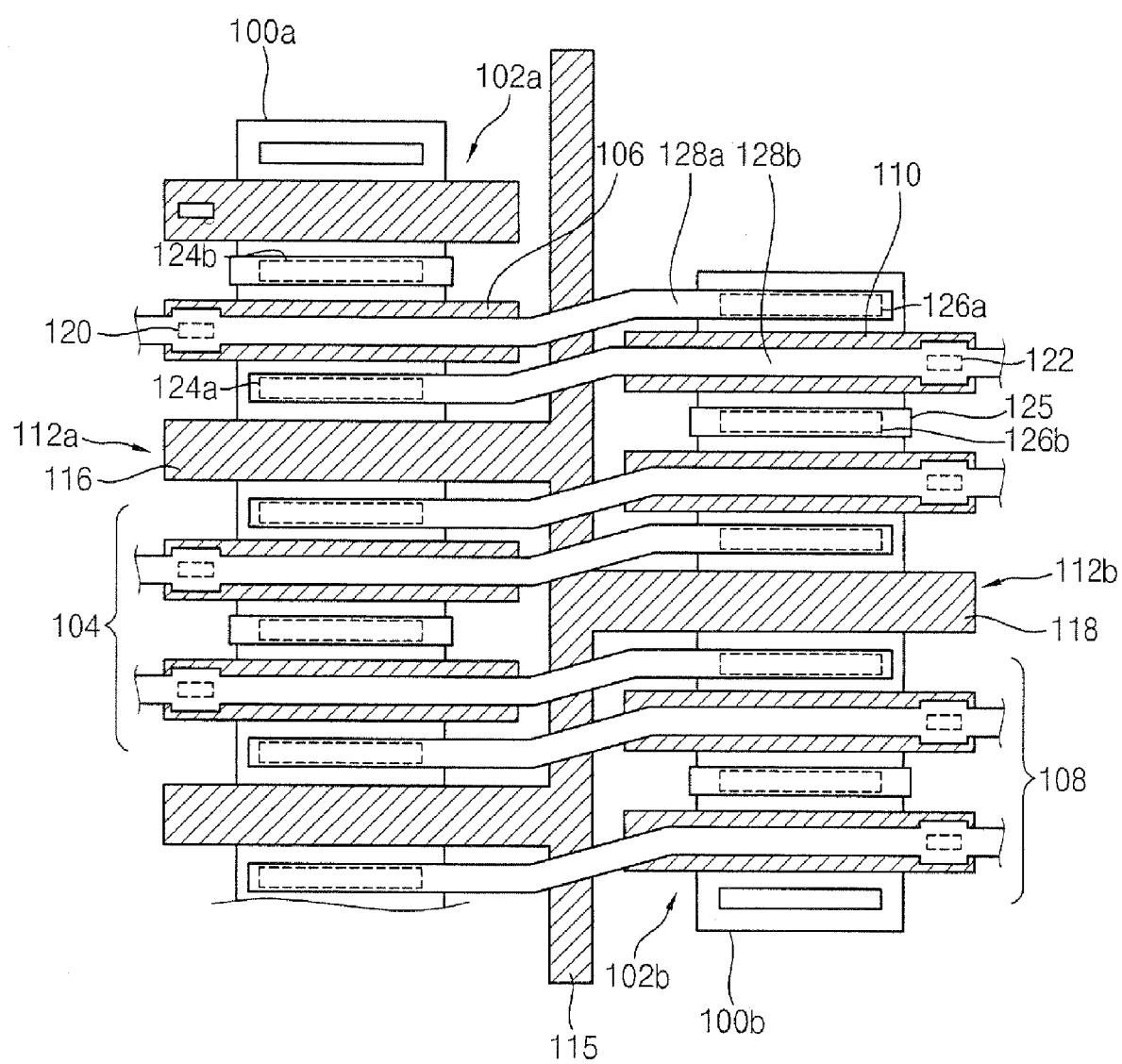

Referring to FIGS. 9 and 14, a third conductive layer (not shown) is formed on the first insulation layer 118 having the plugs 120, 122, 124*a*, 124*b*, 126*a* and 126*b* thereon. The third conductive layer is partially etched to form the bit line 128*a* and the bit line bar 128*b*, which are electrically connected to the plugs 120, 122, 124*a*, 124*b*, 126*a* and 126*b*. A pad 125 may also be formed on some of the plugs 120, 122, 124*a*, 124*b*, 126*a* and 126*b* in the same process as forming the bit line 128*a* and the bit line bar 128*b*.

In one embodiment, the third conductive layer may include a barrier layer (e.g., a barrier metal layer) and a conductive layer (e.g., including tungsten) formed on the first insulation layer 118. A second hard mask layer (not shown) is then formed on the third conductive layer. A third photoresist pattern (not shown) is formed on the second hard mask layer. The second hard mask layer is partially etched using the third photoresist pattern as an etching mask to form a second hard mask pattern (not shown) that extends along the given direction. The third conductive layer is partially etched using the second hard mask pattern to form the bit lines 128*a*, the bit line bars 128*b* and the pads 125 on the first insulation layer 118.

In the illustrated embodiment, the bit lines 128*a* extend from the left of the sense amplifier toward the sense amplifier, and the bit line bars 128*b* extend from the right of the sense amplifier toward the sense amplifier.

Each of the bit lines 128*a* may have a linear shape and contact the first gate plug 120 and the second source plug 126*a*. The first gate plug 120 may be electrically connected to the first gate structure 106 of the first transistor 102*a* and the second source plug 126*a* may be electrically connected to the second source region of a second transistor 102*b* that corresponds to the first transistor 102*a*. Each of the bit line bars 128*b* may have a linear shape and contact the second gate plug 122 and the first source plug 124*a*. The second gate plug 122 may be electrically connected to the second gate structure 110 of the second transistor 102*b*, and the first source plug 124*a* may be electrically connected to the first source region of the first transistor 102*a* that corresponds to the second transistor 102*b*.

Each of the pads 125 contacts the first drain plug 124*b* or the second drain plug 126*b*. The first and second drain plugs 124*b* and 126*b* are electrically connected to the first and second drain regions of the first and second transistors 102*a* and 102*b*, respectively. Each of the pads 125 may have an island shape, unlike the bit lines 128*a* or the bit line bars 128*b*.

Figure 10:
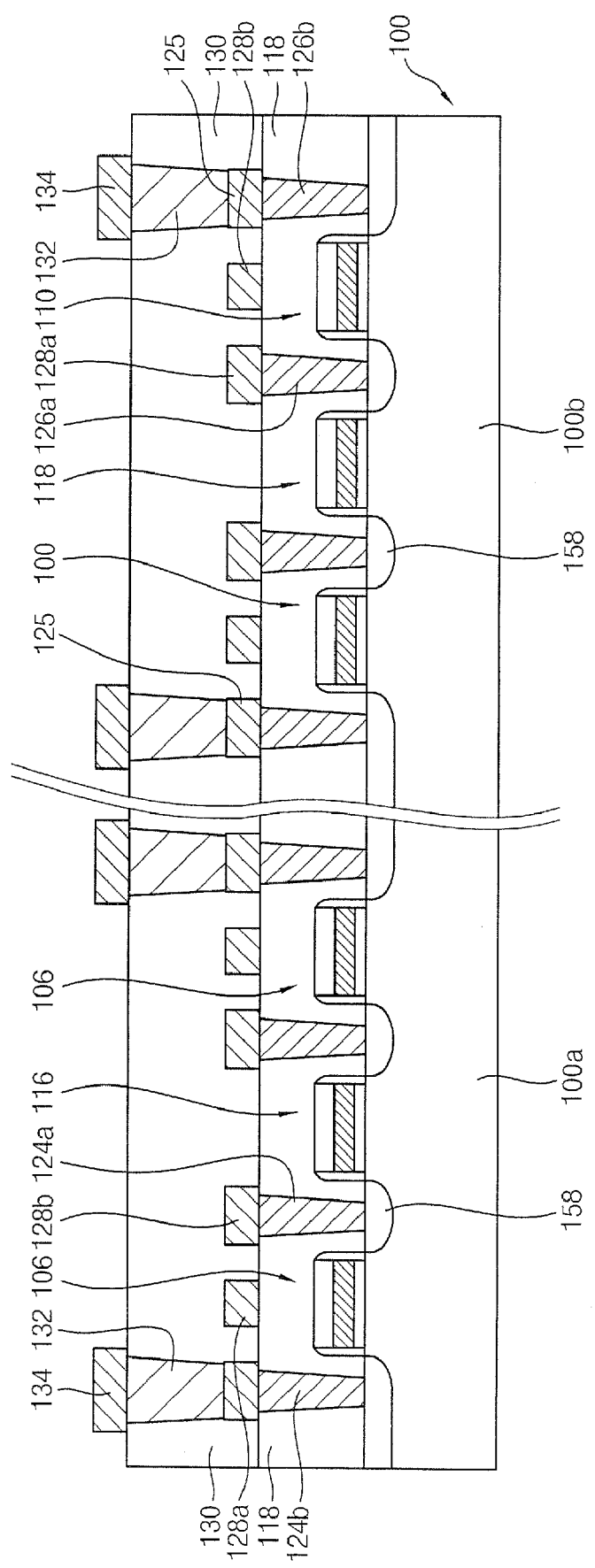
Figure 15:
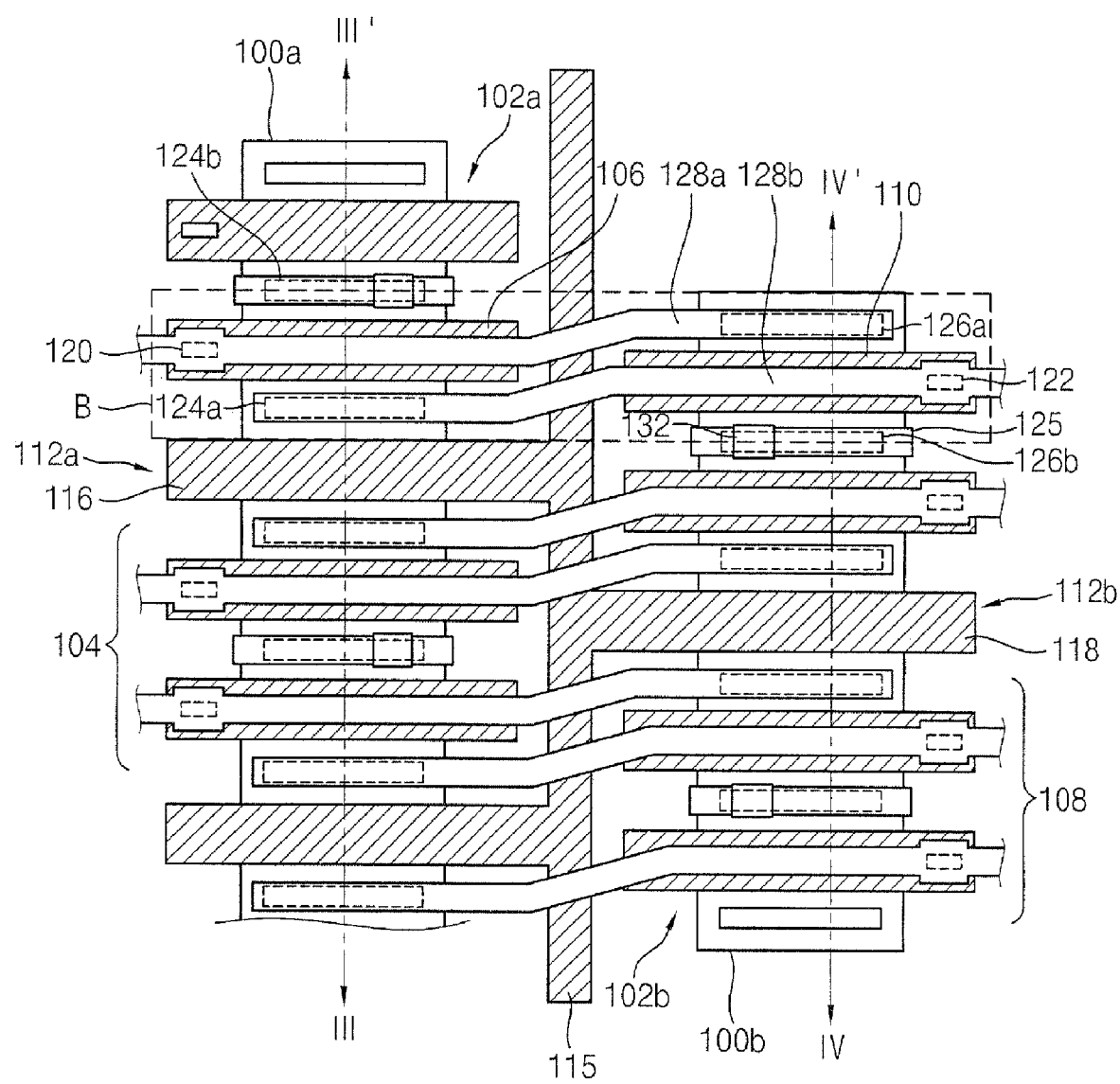

Referring to FIGS. 10 and 15, a second insulation layer 130 is formed on the first insulation layer 118 to cover the bit lines 128*a* and the bit line bars 128*b*. The second insulation layer 130 may include, for example, an oxide material (e.g., BPSG, PSG, SOG, PE-TEOS, USG, HDP-CVD oxide, or the like). The second insulation layer 130 may be formed according to a process such as CVD, PE-CVD, HDP-CVD, ALD, or the like.

A fourth photoresist pattern (not shown) is formed on the second insulation layer 130. The second insulation layer 130 is partially etched using the fourth photoresist pattern as an etching mask to form second openings (not shown). The second openings expose top surfaces of the pads 125 which are electrically connected to the drain regions of the transistors 102*a* and 102*b*.

A fourth conductive layer (not shown) is formed on the second insulation layer 130 to fill the second opening. The fourth conductive layer may be formed by sequentially stacking a barrier layer (e.g., a barrier metal layer) and a conductive layer (e.g., a metal layer) on the second insulation layer 130.

The fourth conductive layer is planarized to form third drain plugs 132 filling the second openings. The fourth conductive layer may be planarized by a CMP process, an etchback process or a combination process of CMP and etchback. Additionally, a metal wiring 134 may be formed on the second insulation layer 130 and connected to the third drain plug 132.

Further, a wiring (not shown) may be formed on the second insulation layer 130 to be connected to the third and fourth gate structures 116 and 118. The wiring may be formed such that the third and fourth transistors 112*a* and 112*b* are maintained in a turned-off state. In an example embodiment, when the third and fourth transistors 112*a* and 112*b* are N-type transistors, the wiring may be connected to ground. Additionally, when the third and fourth transistors 112*a* and 112*b* are P-type transistors, the wiring may be connected to a power source.

According to the embodiments exemplarily described above, the contact area between plugs and corresponding active regions are substantially the same, even if misalignments of the plugs occur. Therefore, mismatches in transistors due to differences between contact areas may be reduced and operational defects of a sense amplifier including the transistors may be reduced.

As exemplarily described herein, some embodiments can be characterized as a semiconductor device. The semiconductor device includes a line-shaped first active region on a substrate, a line-shaped second active region on the substrate, a first transistor group, a second transistor group, a third transistor group, an insulation layer, a plurality of plugs and a wiring. The line-shaped second active region on the substrate is adjacent to the first active region. The first transistor group is formed in the first active region and includes a plurality of first unit circuits, each of which has a plurality of first transistors connected in series. Each of the first transistors includes a first gate structure having a pitch. The second transistor group is formed in the second active region and includes a plurality of second unit circuits, each of which has a plurality of second transistors connected in series. Each of the second transistors includes a second gate structure having the pitch. The third transistor group is formed in the first and second active regions and includes a third transistor configured to electrically isolate each of the first unit circuits and a fourth transistor configured to electrically isolate each of the second unit circuits. The insulation layer covers the first, second and third transistor groups. The plugs are formed in the insulation layer and each of the plugs are electrically connected to one of the first gate structure, the second gate structure, a first source region and a first drain region of each of the first transistors, and a second source region and a second drain region of each of the second transistors. The wiring is electrically connected to some of the plugs.

In some embodiments, a cell area and a peripheral area may be formed in the substrate, and the first and second transistors may be formed in a core region of the peripheral area.

In other embodiments, the first and second transistors may be included in a sense amplifier of the semiconductor device.

In further embodiments, a plurality of cells may be formed in the cell area, and the wiring may include a bit line and a bit line bar of each of the cells.

In additional embodiments, the bit line may be electrically connected to the first gate structure and the second source region, and the bit line bar may be electrically connected to the second gate structure and the first source region.

In additional embodiments, the third and fourth transistors may include a third gate structure and a fourth gate structure, respectively, and the third and fourth gate structures may be connected to be maintained turned off.

In additional embodiments, the first transistor group may include at least two first transistors having a common first drain region.

Other embodiments can be exemplarily characterized as a method of manufacturing a semiconductor device. In the method of manufacturing the semiconductor device, a line-shaped first active region and a line-shaped second active region are formed on a substrate by an isolation process. The first and second active regions are formed in parallel. A plurality of first transistors and a plurality of second transistors are formed in the first and second active regions, respectively. Each of the first transistors includes a first gate structure having a pitch, and each of the second transistors includes a second gate structure having the pitch. A third transistor group including a third transistor configured to electrically isolate each of first transistor groups and a fourth transistor configured to electrically isolate each of second transistor groups are formed. Each of the first transistor groups includes a plurality of the first transistors and each of the second transistor groups includes a plurality of the second transistors. An insulation layer is formed to cover the first, second and third transistor groups. A plurality of plugs is formed through the insulation layer. Each of the plugs are electrically connected to one of the first gate structure, the second gate structure, a first source region and a first drain region of each of the first transistors, and a second source region and a second drain region of each of the second transistors. A wiring configured to be electrically connected to some of the plugs is formed.

In some embodiments, a plurality of cells may be formed in the substrate, and the wiring may include a bit line and a bit line bar of each of the cells.

In other embodiments, the bit line may be formed to make contact with a first gate plug electrically connected to the first gate structure and a second source plug electrically connected to the second source region. The bit line bar may be formed to make contact with a second gate plug electrically connected to the second gate structure and a first source plug electrically connected to the first source region.

In further embodiments, the third and fourth transistors may be formed to be connected to each other.

Still other embodiments can be exemplarily characterized as a sense amplifier. The sense amplifier includes a line-shaped isolated first active region on a substrate, a line-shaped isolated second active region on the substrate, a plurality of first unit circuits, a plurality of second unit circuits, a third transistor and a fourth transistor, a first insulation layer, a plurality of plugs formed in the insulation layer, the bit line and the bit line bar, a second insulation layer, a third drain plug and a wiring. Each of the first unit circuits has a plurality of first transistors connected in series. The first unit circuits are formed in the first active region, and each of the first transistors includes a first gate structure configured to have a pitch and be driven by signals provided by a bit line and a bit line bar. Each of the second unit circuits has a plurality of second transistors connected in series. The second unit circuits are formed in the second active region, and each of the second transistors includes a second gate structure configured to have the pitch and be driven by signals provided by the bit line and the bit line bar. The third transistor and a fourth transistor are formed in the first and second active regions, respectively. The third transistor electrically isolates each of the first unit circuits and a fourth transistor electrically isolates each of the second unit circuits. The first insulation layer covers the first, second, third and fourth transistors. The plugs are formed in the insulation layer. Each of the plugs are electrically connected to one of the first gate structure, the second gate structure, a first source region and a first drain region of each of the first transistors, and a second source region and a second drain region of each of the second transistors. The bit line and the bit line bar electrically connected to some of a first gate plug, a second gate plug, a source plug and a second plug, wherein the first and second gate plugs make contact with the first and second gate structures, respectively, and the first and second source plugs make contact with the first and second source regions. The second insulation layer covers the bit line and the bit line bar on the first insulation layer. The third drain plug is electrically connected to a first drain plug or a second drain plug. The first and second drain plugs make contact with the first and second drain regions, respectively. The wiring is electrically connected to the third drain plug.

In some embodiments, the sense amplifier may have an open bit line structure.

In other embodiments, the bit line may be electrically connected to the first gate structure and the second source region, and the bit line bar may be electrically connected to the second gate structure and the first source region.

In further embodiments, the third and fourth transistors may include a third gate structure and a fourth gate structure, respectively, and the third and fourth gate structures may be connected to be maintained turned off.

Lastly, other embodiments can be exemplarily characterized as a method of forming a sense amplifier. In the method of forming the sense amplifier, an island-shaped first active region and an island-shaped second active region are formed on a substrate by an isolation process. A plurality of first unit circuits, each of which has a plurality of first transistors connected in series, is formed in the first active region. Each of the first transistors includes a first gate structure having a pitch, and the first gate structure is driven by signals provided by a bit line and a bit line bar. A plurality of second unit circuits, each of which has a plurality of second transistors connected in series, is formed in the second active region. Each of the second transistors includes a second gate structure having the pitch, and the second gate structure is driven by signals provided by the bit line and the bit line bar. A third transistor and a fourth transistor are formed in the first and second active regions, respectively. The third transistor electrically isolates each of the first unit circuits, and the fourth transistor electrically isolates each of the second unit circuits. A first insulation layer is formed to cover the first, second, third and fourth transistors. A plurality of plugs is formed through the insulation layer. Each of the plugs are electrically connected to one of the first gate structure, the second gate structure, a first source region and a first drain region of each of the first transistors, and a second source region and a second drain region of each of the second transistors. The bit line and the bit line bar electrically connected to some of a first gate plug, a second gate plug, a source plug and a second plug are formed. The first and second gate plugs make contact with the first and second gate structures, respectively, and the first and second source plugs make contact with the first and second source regions. A second insulation layer is formed on the first insulation layer to cover the bit line and the bit line bar. A third drain plug is formed to be electrically connected to a first drain plug or a second drain plug. The first and second drain plugs make contact with the first and second drain regions, respectively. A wiring is formed to be electrically connected to the third drain plug.

In some embodiments, the sense amplifier may have an open bit line structure.

In other embodiments, the bit line may be formed to make contact with the first gate plug electrically connected to the first gate structure and the second source plug electrically connected to the second source region. The bit line bar may be formed to make contact with the second gate plug electrically connected to the second gate structure and the first source plug electrically connected to the first source region.

In further embodiments, the third and fourth transistors may be formed to be connected to each other.

In additional embodiments, forming the bit line and the bit line bar may further include forming a pad electrically connected to the first drain plug or the second drain plug. The first and second drain plugs make contact with the first and second drain regions, respectively.

According to some example embodiments, a transistor is formed instead of an isolation layer for electrically isolating each unit amplification circuits is not formed. Thus, all areas, with which plugs make contact with a substrate, may be included in an active region of the substrate even if misalignments of the plugs occur in a formation of the plugs.

That is, differences between contact resistances of each of the plugs may be reduced because no portions of the plugs may make contact with an isolation region of the substrate even if misalignments of the plugs occur. Therefore, mismatches in transistors due to differences between amounts of area, with which each of the plugs makes contact with the active region, may be reduced, and operational defects of a sense amplifier including the transistors may be reduced.

The embodiments described above may be employed in semiconductor devices having unit circuits each of which is repeatedly disposed therein. For example, the present invention may be employed in a variety of unit devices such as a sense amplifier of a bit line, a column decoder, a low decoder, a chip selection line (CSL), etc., which are formed in a core region.

It will be apparent to those skilled in the art that various modifications and variations can be made in the present invention. Thus, it is intended that the present invention cover the modifications and variations of this invention provided they come within the scope of the appended claims and their equivalents.

What is claimed is:

1. A semiconductor device comprising:
   first and second active regions in a semiconductor substrate;
   a plurality of first unit circuits in the first active region, wherein each of the plurality of first unit circuits includes a plurality of first transistors, wherein each of the plurality of first transistors includes a first gate structure;
   a plurality of second unit circuits in the second active region, wherein each of the plurality of second unit circuits includes a plurality of second transistors, wherein each of the plurality of second transistors includes a second gate structure;
   a third transistor, wherein the plurality of first unit circuits are electrically isolated from each other by the third transistor;
   a fourth transistor, wherein the plurality of second unit circuits are electrically isolated from each other by the fourth transistor;
   an insulation layer overlying the plurality of first unit circuits, the plurality of second unit circuits, the third transistor and the fourth transistor;
   a plurality of first plugs in the insulation layer, wherein the first plugs are electrically connected to the first gate structure of one of the plurality of first transistors, and the second gate structure of one of the plurality of second transistors;
   a plurality of second plugs in the insulation layer, wherein the second plugs are electrically connected to a first source region and a first drain region of the one of the plurality of first transistors, and a second source region and a second drain region of the one of the plurality of second transistors; and
   a wiring electrically connected to some of the plurality of first and second plugs,
   wherein contact areas of the plurality of second plugs are substantially the same even if misalignments of the plurality of second plugs occur, so that contact resistances of the plurality of second plugs are substantially the same,
   wherein the wiring includes a bit line and a bit line bar, and
   wherein the bit line is electrically connected to the first gate structure of the one of the plurality of first transistors and the second source region and the bit line bar is electrically connected to the second gate structure of the one of the plurality of second transistors and the first source region.

2. The semiconductor device of claim 1, wherein the first and second active regions are line-shaped.

3. The semiconductor device of claim 1, wherein the plurality of first transistors of each of the plurality of first unit circuits are connected in series and the plurality of second transistors of each of the plurality of second unit circuits are connected in series.

4. The semiconductor device of claim 1, wherein the first gate structures of each of the plurality of first unit circuits are separated from each other by a pitch and wherein the second gate structures of each of the plurality of second unit circuits are separated from each other by the pitch.

5. The semiconductor device of claim 1, further comprising a sense amplifier, the sense amplifier including the one of the plurality of first transistors and the one of the plurality of second transistors.

6. The semiconductor device of claim 1, wherein the third and fourth transistors include a third gate structure and a fourth gate structure, respectively, and the third and fourth gate structures are maintainable in a turned-off state.

7. The semiconductor device of claim 1, wherein each of the plurality of first unit circuits includes at least two first transistors having a common first drain region.

8. A semiconductor device comprising:
a first active region and a second active region in a substrate;
a plurality of first unit circuits in the first active region, wherein each of the plurality of first unit circuits includes a plurality of first transistors, wherein each of the first transistors includes a first gate structure;
a plurality of second unit circuits in the second active region, wherein each of the plurality of second unit circuits includes a plurality of second transistors, wherein each of the second transistors includes a second gate structure;
a third transistor in the first active region, wherein the plurality of first unit circuits are electrically isolated from each other by the third transistor;
a fourth transistor in the second active region, wherein the plurality of second unit circuits are electrically isolated from each other by the fourth transistor;
a first insulation layer over the first, second, third and fourth transistors;
a plurality of first plugs in the insulation layer, wherein the plurality of first plugs include a first gate plug electrically connected to the first gate structure of one of the plurality of first transistors, and a second gate plug electrically connected to the second gate structure of one of the plurality of second transistors;
a plurality of second plugs in the insulation layer, wherein the plurality of second plugs include a first source plug and a first drain plug electrically connected to a first source region and a first drain region of the one of the plurality of first transistors, and a second source plug and a second drain plug electrically connected to a second source region and a second drain region of the one of the plurality of second transistors;
a bit line and a bit line bar on the first insulation layer, wherein the first gate plug, the second gate plug, the first source plug, and the second source plug are electrically connected to the bit line or the bit line bar;
a second insulation layer over the bit line and the bit line bar;
a third drain plug electrically connected to the first drain plug or the second drain plug; and
a wiring electrically connected to the third drain plug,
wherein contact areas of the plurality of second plugs are substantially the same even if misalignments of the plurality of second plugs occur, so that contact resistances of the plurality of second plugs are substantially the same, and
wherein the bit line is electrically connected to the first gate plug and the second source plug and the bit line bar is electrically connected to the second gate plug and the first source plug.

9. The semiconductor device of claim 8, wherein the first and second active regions are isolated and line-shaped.

10. The semiconductor device of claim 8, wherein the plurality of first transistors of each of the plurality of first unit circuits are connected in series and the plurality of second transistors of each of the plurality of second unit circuits are connected in series.

11. The semiconductor device of claim 8, wherein the first gate structures of each of the plurality of first unit circuits are separated from each other by a pitch and wherein the second gate structures of each of the plurality of second unit circuits are separated from each other by the pitch.

12. The semiconductor device of claim 8, further comprising a sense amplifier, the sense amplifier including the one of the plurality of first transistors and the one of the plurality of second transistors, wherein the sense amplifier has an open bit line structure.

13. The semiconductor device of claim 8, wherein the third and fourth transistors include a third gate structure and a fourth gate structure, respectively, and the third and fourth gate structures are maintainable in a turned-off state.

* * * * *

UNITED STATES PATENT AND TRADEMARK OFFICE
CERTIFICATE OF CORRECTION

PATENT NO.        : 7,605,409 B2  
APPLICATION NO.   : 11/673403  
DATED             : October 20, 2009  
INVENTOR(S)       : Soon-Hong Ahn et al.

Page 1 of 1

It is certified that error appears in the above-identified patent and that said Letters Patent is hereby corrected as shown below:

Column 8, line 14, the word "4," should read -- 4. --;  
Column 9, line 48, the word "10a" should read -- 100a --.

Signed and Sealed this

Eighth Day of December, 2009

David J. Kappos  
*Director of the United States Patent and Trademark Office*